United States Patent
Kälvesten et al.

(10) Patent No.: US 9,312,217 B2
(45) Date of Patent: Apr. 12, 2016

(54) METHODS FOR MAKING A STARTING SUBSTRATE WAFER FOR SEMICONDUCTOR ENGINEERING HAVING WAFER THROUGH CONNECTIONS

(75) Inventors: Edvard Kälvesten, Hägersten (SE); Tomas Bauer, Kista (SE); Thorbjörn Ebefors, Huddinge (SE)

(73) Assignee: Silex Microsystems AB, Jarfalla (SE)

( * ) Notice: Subject to any disclaimer, the term of this patent is extended or adjusted under 35 U.S.C. 154(b) by 784 days.

(21) Appl. No.: 12/162,599

(22) PCT Filed: Jan. 31, 2007

(86) PCT No.: PCT/SE2007/050053
§ 371 (c)(1),
(2), (4) Date: Nov. 28, 2008

(87) PCT Pub. No.: WO2007/089207
PCT Pub. Date: Aug. 9, 2007

(65) Prior Publication Data
US 2009/0195948 A1 Aug. 6, 2009

(30) Foreign Application Priority Data
Feb. 1, 2006 (SE) ........................ 0600214

(51) Int. Cl.
*H01L 23/498* (2006.01)
*H01L 21/768* (2006.01)
*H01L 23/00* (2006.01)

(52) U.S. Cl.
CPC .... *H01L 23/49827* (2013.01); *H01L 21/76898* (2013.01); *H01L 24/48* (2013.01);*H01L2224/32225* (2013.01); *H01L 2224/48091* (2013.01); *H01L 2224/48227* (2013.01); *H01L 2224/48237* (2013.01);

(Continued)

(58) Field of Classification Search
CPC ................ H01L 21/76831; H01L 21/76883; H01L 23/5384
See application file for complete search history.

(56) References Cited

U.S. PATENT DOCUMENTS 3,427,709 A * 2/1969 Schutze et al. ............... 438/404
3,787,252 A 1/1974 Filippazzi et al.
(Continued)

FOREIGN PATENT DOCUMENTS

EP 1306901 A2 10/2002
JP 359072783 * 4/1984
(Continued)

*Primary Examiner* — Mohammad Choudhry
(74) *Attorney, Agent, or Firm* — Pierce Atwood LLP; Kevin M. Farrell; Reza Sadr

(57) ABSTRACT

The invention relates to a method of making a starting substrate wafer for semiconductor engineering having electrical wafer through connections (140; 192). It comprises providing a wafer (110; 150) having a front side and a back side and having a base of low resistivity silicon and a layer of high resistivity material on the front side. On the wafer there are islands of low resistivity material in the layer of high resistivity material. The islands are in contact with the silicon base material. Trenches are etched from the back side of the wafer but not all the way through the wafer to provide insulating enclosures defining the wafer through connections (140; 192). The trenches are filled with insulating material. Then the front side of the wafer is grinded to expose the insulating material to create the wafer through connections. Also there is provided a wafer substrate for making integrated electronic circuits and/or components, comprising a low resistivity silicon base (110) having a high resistivity top layer (122) suitable for semiconductor engineering, characterized by having low resistivity wafer through connections (140).

7 Claims, 7 Drawing Sheets

(52) U.S. Cl.
CPC ............... *H01L 2224/73265* (2013.01); *H01L 2924/01019* (2013.01); *H01L 2924/01057* (2013.01); *H01L 2924/01078* (2013.01); *H01L 2924/01079* (2013.01); *H01L 2924/01322* (2013.01); *H01L 2924/10253* (2013.01); *H01L 2924/12042* (2013.01); *H01L 2924/12043* (2013.01); *H01L 2924/1461* (2013.01); *H01L 2924/15311* (2013.01); *H01L 2924/19105* (2013.01); *H01L 2924/3025* (2013.01)

(56) References Cited

U.S. PATENT DOCUMENTS

| | | |
|---|---|---|
| 3,982,268 A | 9/1976 | Anthony et al. |
| 4,724,223 A | 2/1988 | Ditchek |
| 4,785,341 A | 11/1988 | Ning et al. |
| 6,221,769 B1 | 4/2001 | Dhong et al. |
| 2002/0074615 A1 | 6/2002 | Honda |
| 2002/0119640 A1 | 8/2002 | Gonzalez |
| 2005/0121768 A1 | 6/2005 | Edelstein et al. |

FOREIGN PATENT DOCUMENTS

| | | | |
|---|---|---|---|
| JP | 359072783 A | * | 4/1984 |
| JP | 02000252512 | * | 9/2000 |
| JP | 020000252512 | * | 9/2000 |
| WO | 9531006 A1 | | 11/1995 |
| WO | 2004084300 A1 | | 9/2004 |
| WO | 2005101475 A1 | | 10/2005 |

\* cited by examiner

METHODS FOR MAKING A STARTING SUBSTRATE WAFER FOR SEMICONDUCTOR ENGINEERING HAVING WAFER THROUGH CONNECTIONS

The present invention relates to means and methods for providing vias for starting substrate wafers for semiconductor engineering, where the contact resistance in the interface between metal contact pads and the wafer vias will be reduced.

BACKGROUND OF THE INVENTION

Applicants own Swedish patent SE-0300784-6 (publication number 526 366) discloses and claims through connections (also referred to as vias) made in a wafer material from the native wafer itself. The vias thereby comprises the same material as the remainder of the wafer and will thus be capable of being processed in a more versatile manner, as describe in detail in said patent, the disclosure of which is incorporated herein in its entirety by reference.

However, for certain applications the resistivity that is attainable in these prior art vias may be to low, and it would be desirable to provide vias with very low resistivity.

It is known to provide vias made of metal, but the conventional methods used (sputtering, plating, or evaporation methods) are all suffering from the problem that it is difficult to fill very small holes with them. Metal vias only allows via last processes (e.g. CMOS structures must be made before via formation).

SUMMARY OF THE INVENTION

The general problem to be solved by the present invention is that on one hand It is desirable to have substrates (wafers) having low resistivity electrical through connections (vias). This requires that the starting substrate for making the vias exhibits a low resistivity, e.g. it is highly doped.

On the other hand electronic circuits are made in high resistivity materials (such as non-doped silicon). It is desirable to connect the circuits made on one side of a wafer with structures on the other side using vias of the type mentioned.

These two requirements and preconditions are contradictory.

The present invention provides methods for solving this problem.

Thus, the object of the present invention is to provide a new method for making electrical through connections (vias) for a wafer, and a wafer as a substrate for semiconductor engineering in general, i.e. further processing to make and package various kinds of electronic circuits and/or components and/or for MEMS applications.

The novel method as defined herein.

In a further aspect of the invention there is provided a wafer substrate for making integrated electronic circuits and/or components, comprising a low resistivity silicon base having a high resistivity top layer suitable for semiconductor engineering, characterized by having low resistivity wafer through connections, defined herein.

In a still further aspect there is provided a An electronic device comprising a component structure on a wafer, having vias essentially consisting of wafer native material, preferably doped to exhibit a low resistivity, and further comprising areas of low resistivity in the contact areas between wafer and components thereon, defined herein.

Furthermore, an aspect of the invention provides an intermediate wafer product, comprising a planar substrate suitably of a semiconductor material, provided with a pattern of spots having low resistivity, with electrical through connections between the spots, and usable as starting material for semiconductor engineering to make components on one side of the wafer, defined herein.

Also, there is provided a diode like structure integrated in a via, comprising a doped via and an oppositely doped layer in or on the via, defined herein, and a method of making it, defined herein.

DETAILED DESCRIPTION OF THE INVENTION

Figure 1:
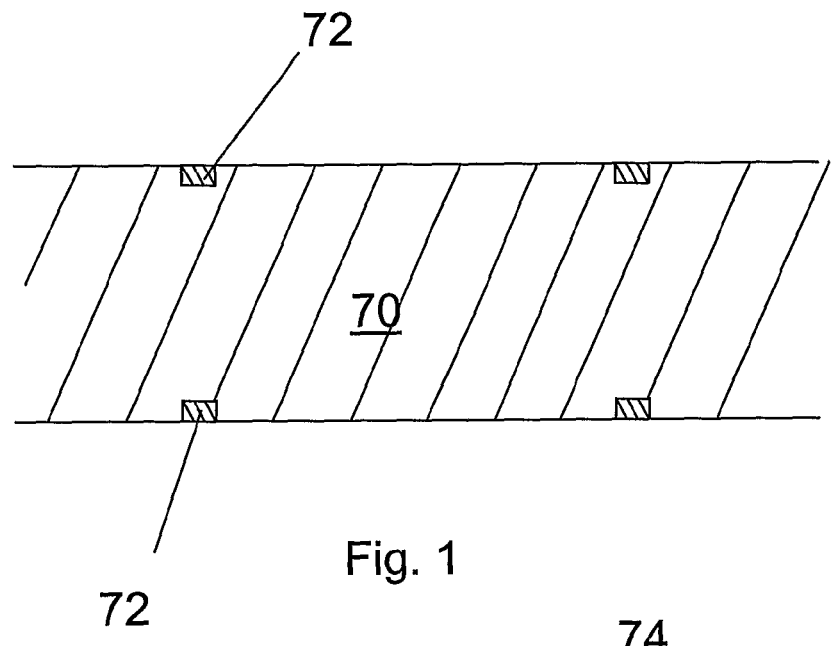
FIG. 1 illustrates a first step in a process sequence according to the present invention.
Figure 2:
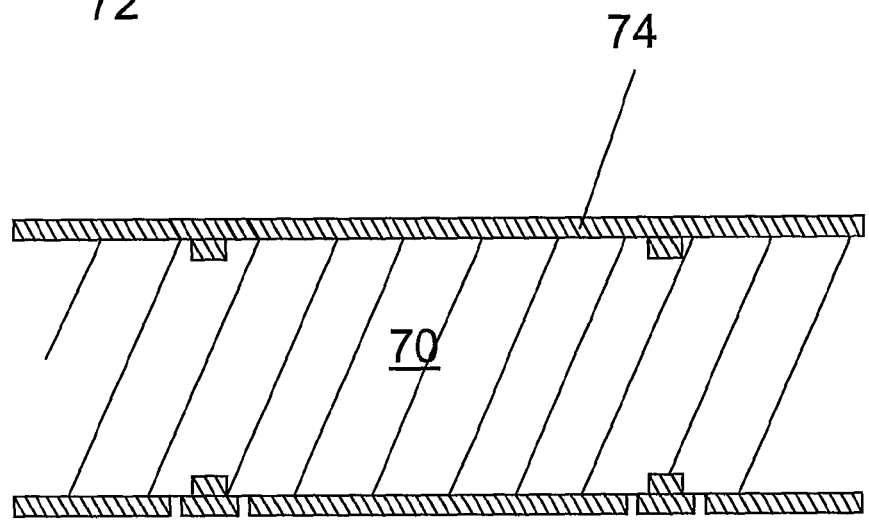
FIG. 2 illustrates a second step in a process sequence according to the present invention.

For the purpose of this invention the term "semiconductor engineering" shall be taken to mean any processing on semiconductor wafers, i.e. further processing of wafer material to make various kinds of circuits, components and/or devices, electronic circuits and/or components and/or MEMS applications.

The present invention relates to a method for providing vias for CMOS wafers, where the resistance between the electronic (CMOS) layers and the wafer vias will be reduced.

For providing a planar substrate with electrical through connections, or as they will referred to below, vias, a method is used which is the subject of a co-pending International Application PCT/SE07/050,052. It comprises the provision of a suitable substrate, normally a standard semiconductor wafer, commonly employed for the manufacture of various semiconductor devices. The planar substrate is preferably a semiconductor wafer, preferably selected from silicon, doped silicon, GaAs, InP, SiC etc. The wafer is normally 0.300-0.675 mm thick.

In particular the above mentioned method is applicable to cases where it is desirable to provide connections between a front side and a back side of such a wafer, where there are high demands on the resistivity in said connections to be as low as possible.

The present inventors have now devised a method for providing vias for CMOS wafers, where the contact resistance in the interface between metal contact pads and the wafer vias will be reduced.

This method is illustrated in FIGS. 1-4, and will be described below.

First a wafer of silicon 70 (or other suitable material) is patterned on both sides with highly doped "spots" 72. Such patterning can be performed with standard techniques of lithography etc. well known to the skilled man. The doping can be made through a suitable mask defining said pattern i.a. by ion implantation, although other methods are possible too.

In a next step the CMOS structure 74 is made on one side of the wafer 70.

In order to make the vias 76, a method disclosed in applicants Swedish patent mentioned previously herein can be employed. This entails etching trenches 78, suitably by DRIE, in the wafer from the back side all the way through the silicon part of the wafer, after having patterned the back side of the wafer appropriately, see FIG. 2. Reference is made to said Swedish patent for this, the disclosure of the patent being incorporated herein by reference.

Figure 3:
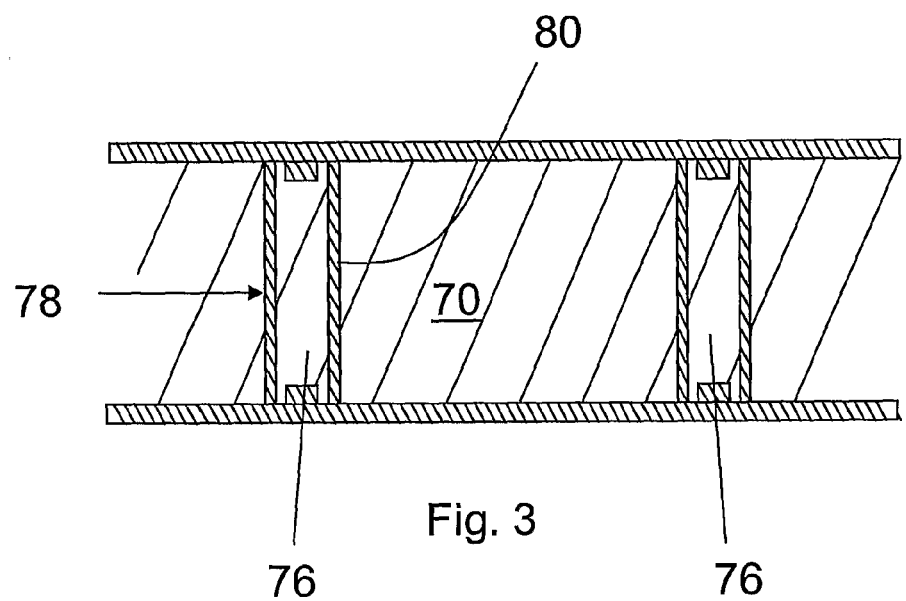
FIG. 3 illustrates a third step in a process sequence according to the present invention.

The trenches are then at least partially filled with a dielectric material 80 to create an insulating barrier, see FIG. 3. By partially is meant the entire trench is not filled but the side walls inside the trench must be covered. Also the back side of the wafer is covered. The dielectric on the wafer back side can be removed, and a suitable dielectric can be deposited again on the back side if the first dielectric should be undesirable.

Figure 4:
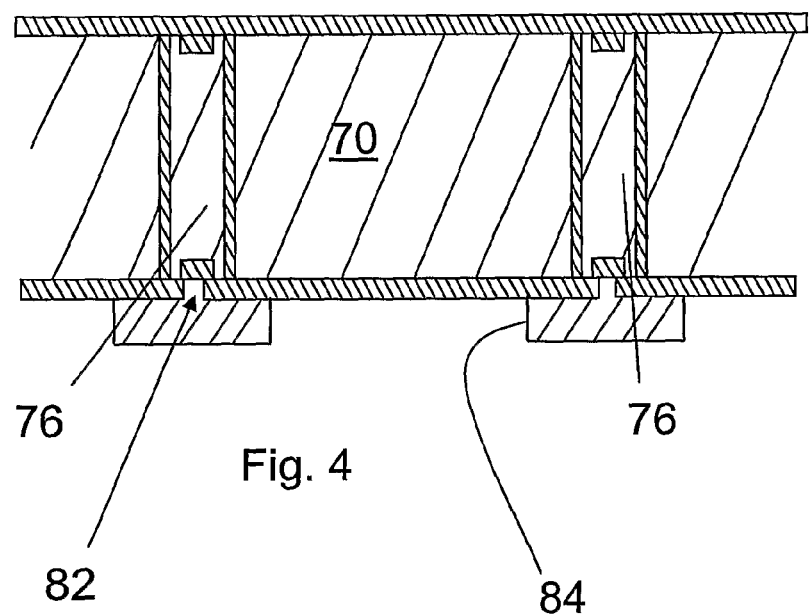
FIG. 4 illustrates a result of a process sequence according to the present invention.
Figure 5:
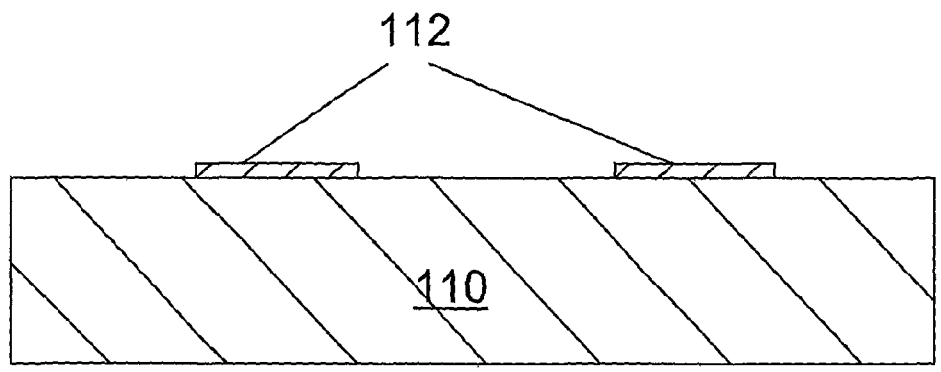
FIG. 5 illustrates a first step in a process sequence according to a further embodiment of the present invention.

Finally, as shown in FIG. 4, the dielectric layer is opened up 82 at the highly doped "spots", and metal pads 84 forming contact points for attaching further electric components to the wafer back side, thereby connecting them to the electronic structures on the other side of the wafer.

Alternatively, if the dielectric is removed, the entire back side can be provided with a metal layer, and then by lithography, unwanted metal can be etched away leaving metal pads located on top of the vias.

With this method an electronic device can be made which comprises a CMOS structure on a wafer, having vias essentially consisting of wafer native material, preferably doped to exhibit a low resistivity, and further comprising areas of low resistivity in the contact areas between wafer and components thereon.

It is also within the inventive concept to make the vias with a process similar to the one described previously herein, and which is the subject of co-pending International application PST/SE07/050,052, where the wafer is exposed to molten metal that will enter holes by wetting force or capillary forces.

In this case a CMOS wafer, i.e a wafer having a CMOS structure on one side is provided with holes extending through the wafer. These holes are preferably etched using e.g. DRIE. The holes are treated such that the side walls inside them exhibits wettability. In this case however, the molten metal must exhibit a relatively low melting temperature, i.e. <400° C., in order not to affect the CMOS structures and its relatively delicate components. Suitably such solder/alloy/material is deposited on the back side, either as covering layer, which is subsequently masked and etched to provide metal spots comprising just enough metal to fill the holes when the metal is melted.

Alternatively, the back side is patterned to leave openings just above the holes and then metal is deposited on top. Upon melting the metal will be drawn into the holes. Care should preferably be taken to optimize the amount of metal so as to avoid excess metal on the wafer.

The substrate surface of the back side should preferably be treated so as not to be wetted by the metal, or at least exhibit lower wettability than the side walls in the holes.

The inventive idea also encompasses an intermediate wafer product, comprising a planar substrate suitably of a semiconductor material, provided with a pattern of spots having low resistivity, usable as a starting material for making CMOS wafers having components on both sides of said wafer, with electrical through connections between them.

In a second embodiment the invention provides a starting substrate shown in FIG. 8 and a method of making it, and will now be described with reference to FIGS. 5-8.

Thus, starting with a low resistivity substrate wafer 110, e.g of silicon, an oxide mask 112 is provided on the wafer in a pattern defining the location and size of the vias to be made subsequently.

Figure 6:
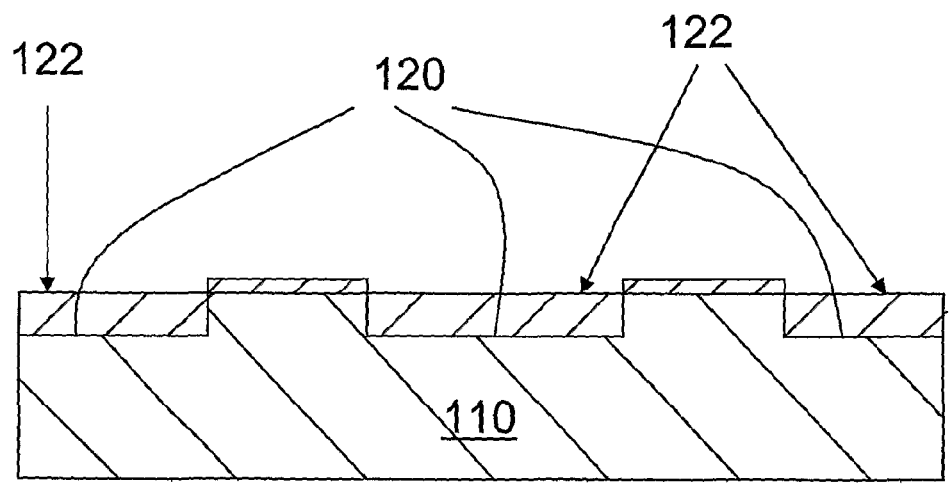
FIG. 6 illustrates a second step in a process sequence according to a further embodiment of the present invention.

Then the non-masked areas are etched away (DRIE/KOH) to a predetermined depth to form depressions 120, and then high resistivity material 122 is grown by epitaxial growth on the etched away areas, see FIG. 6. These areas will form the substrate for the manufacturing of electronic circuits.

Figure 7:
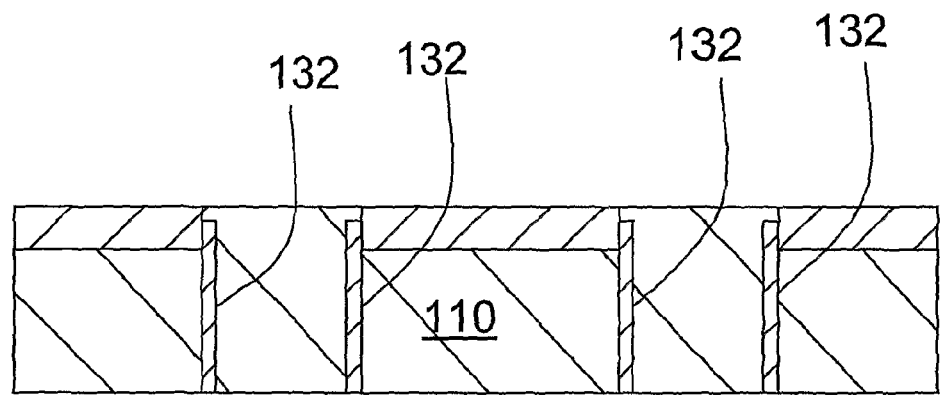
FIG. 7 illustrates a third step in a process sequence according to a further embodiment of the present invention.

Trenches 132 are etched from the back side but not all the way through the wafer, as indicated in FIG. 7. The trenches are then filled with an insulating material 133.

Figure 8:
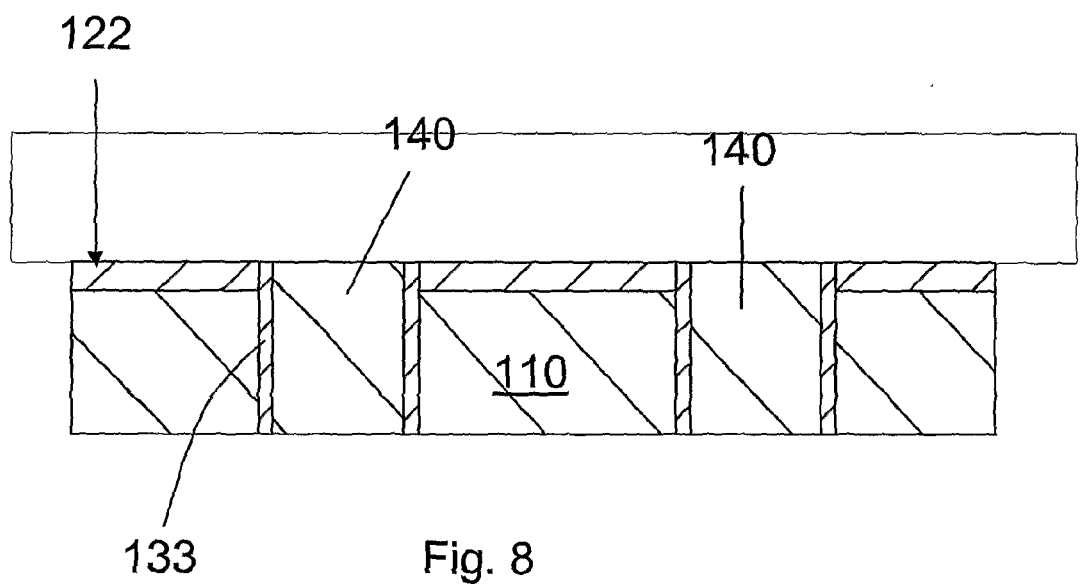
FIG. 8 illustrates a result of a process sequence according to the embodiment of the present invention shown in FIGS. 11-13.

Finally, as shown in FIG. 8, the wafer is grinded such that the insulating trenches become exposed to define vias 140. This product can be used as a starting substrate for the manufacture of any desired electronic circuits/components, which subsequently can be connected to the vias by routing.

In an alternative approach, illustrated in FIGS. 9-13, that will result in an equivalent starting substrate, the method starts with a low resistivity wafer 150 having an epitaxially grown high resistivity layer 152 on top.

Figure 9:
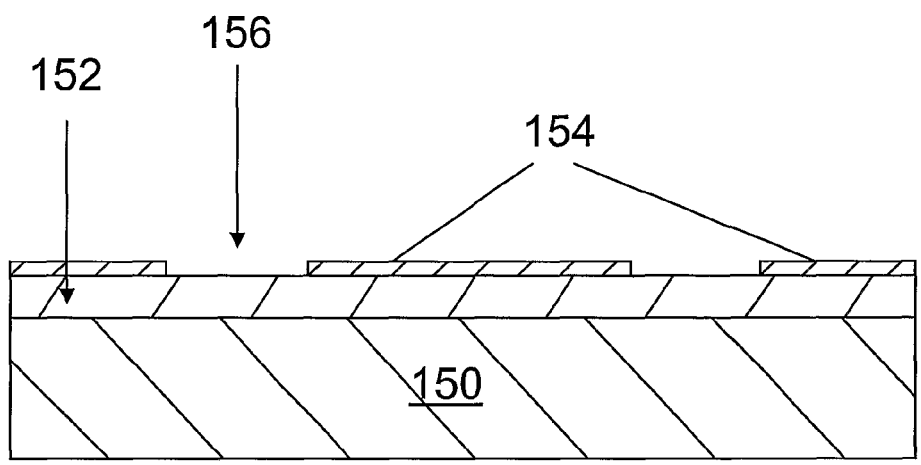
FIG. 9 illustrates a first step in a process sequence according to a still further embodiment of the present invention.
Figure 10:
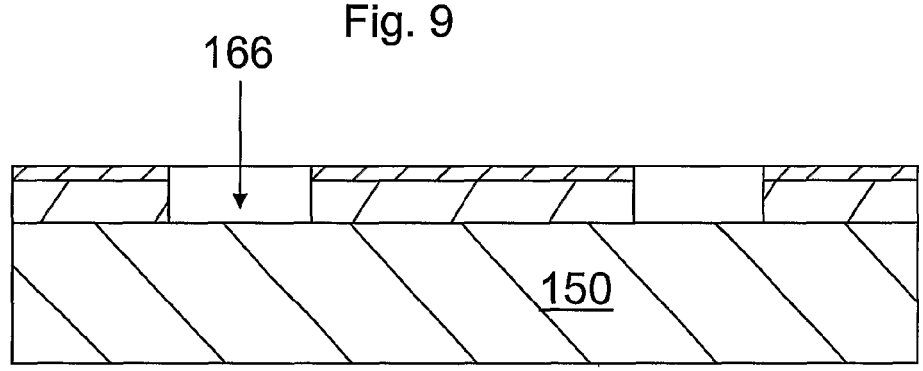
FIG. 10 illustrates a second step in a process sequence according to a still further embodiment of the present invention.
Figure 11:
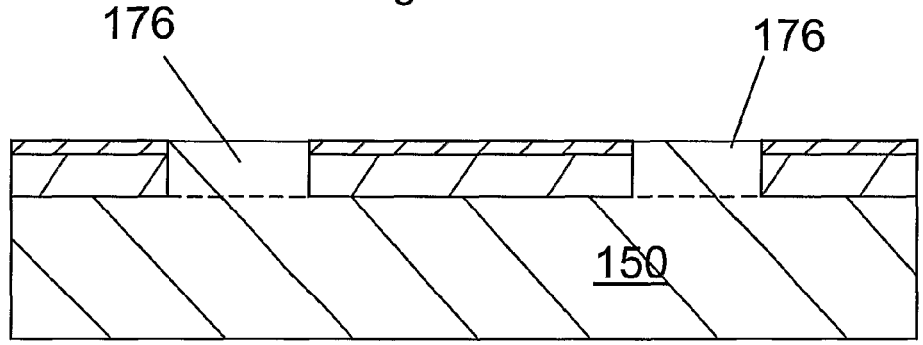
FIG. 11 illustrates a third step in a process sequence according to a still further embodiment of the present invention.
Figure 12:
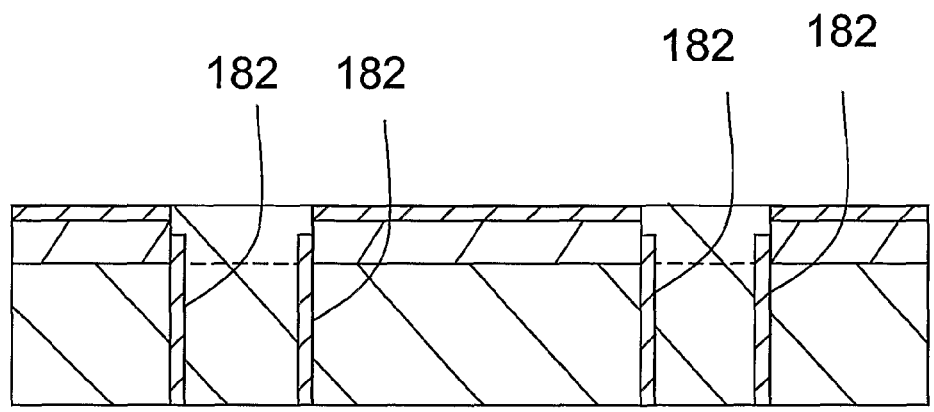
FIG. 12 illustrates a fourth step in a process sequence according to a still further embodiment of the present invention.

Instead of patterning to define the vias by masking as described above, the pattern 154 is inverted such that holes 156 are opened in the mask defining the size and location of the vias. This is schematically illustrated in FIG. 9. The high resistivity layer is etched through, see FIG. 9, down to the low resistivity via material opening up depressions 166 in the wafer. Then by epitaxial growth the opened up holes are filled 176 with the same or at least similar low resistivity material as in the wafer.

Figure 13:
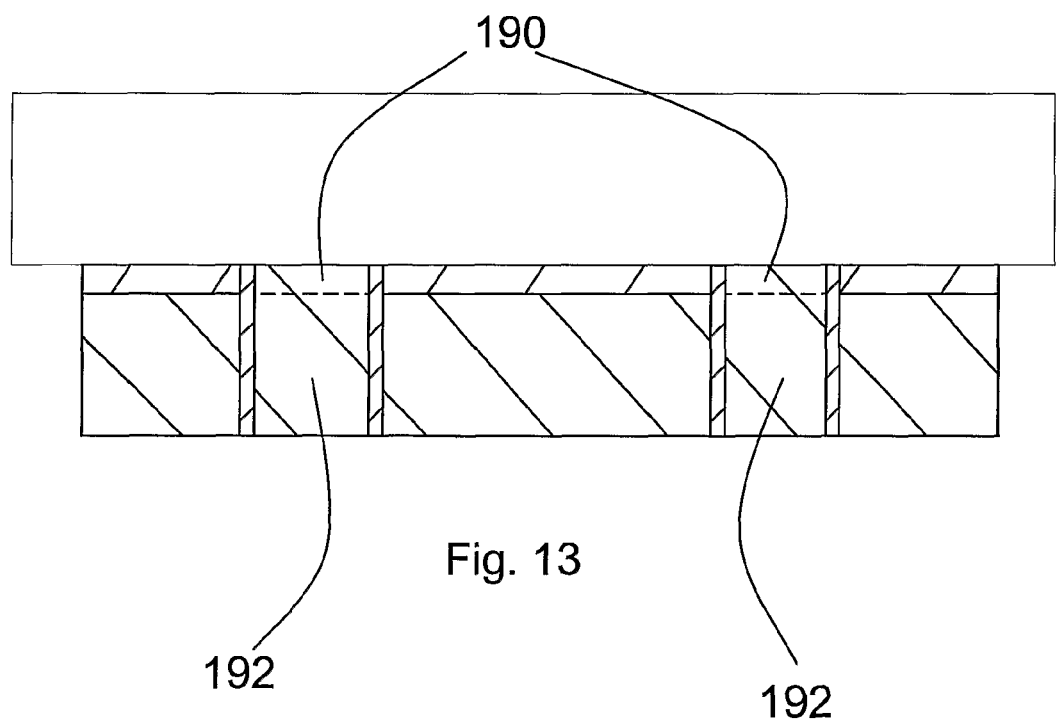
FIG. 13 illustrates the result of the process sequence according to a still further embodiment of the present invention shown in FIGS. 9-12.

Again, trenches 182 are etched as in the previous embodiment, and filled with an insulating material, where upon the same grinding process as was described above is performed to provide the final product shown in FIG. 13, having vias 192.

The only difference between the embodiment of FIG. 13 and the one of FIG. 8 is illustrated by the broken line at 190 indicating the interface between wafer native silicon and epitaxially grown material.

Figure 14:
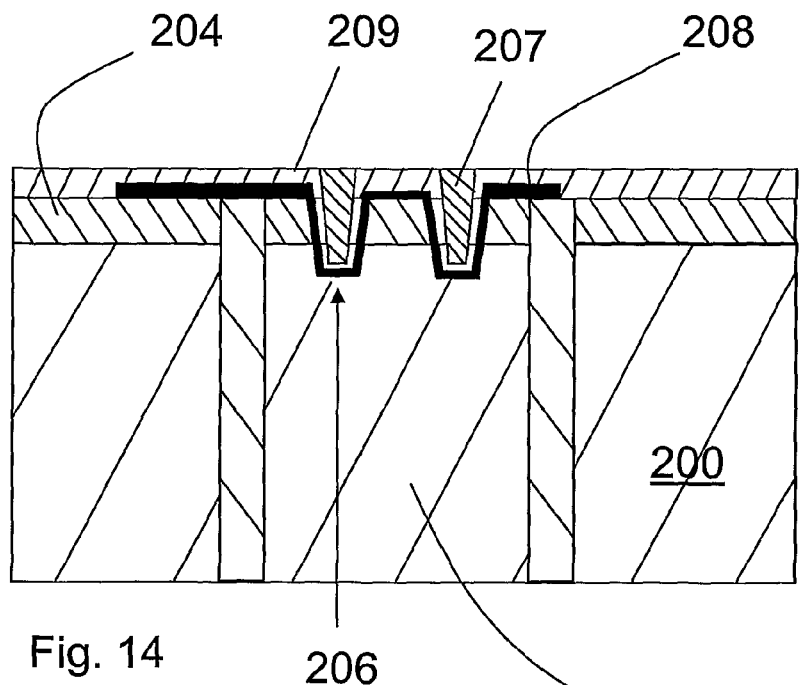
FIG. 14 illustrates making of polysilicon contacts in accordance with the invention.

A still further embodiment is shown in FIG. 14. Here vias 202 are first made by methods described above in a low resistivity substrate wafer 200 having a high resistivity (e.g. non-doped) epitaxial layer 204 on top. Electronic circuits or components are made as desired in the top layer 204.

By patterning and etching depressions 206 are made through the top layer and down into the via material. Routing structures for contacting the circuits made in the top layer with the vias 202 are defined by patterning end etching to make a mask. Then polysilicon 208 is applied through the mask and doped. After removing the mask, subsequently the wafer is covered with an SiO$_2$ layer 209 by PECVD. Undoped polysilicon 207 fills the residual depressions.

In this embodiment there is a possibility to utilize the contact made to provide a diode function. Namely, if the low resistivity silicon in the via is n-doped, and the polysilicon in the layer 208 is p-doped (or vise versa), the contact will only conduct electric current in one direction and can be used as a limiter diode for ESD protection.

In a further variation, the diode like structure can be made as a photodiode. By virtue of the possibility in accordance with the invention to make very close packed vias, it will thus be possible to make large array of very densely spaced photodiodes, usable for i.a. image recording and many other applications.

Figure 15:
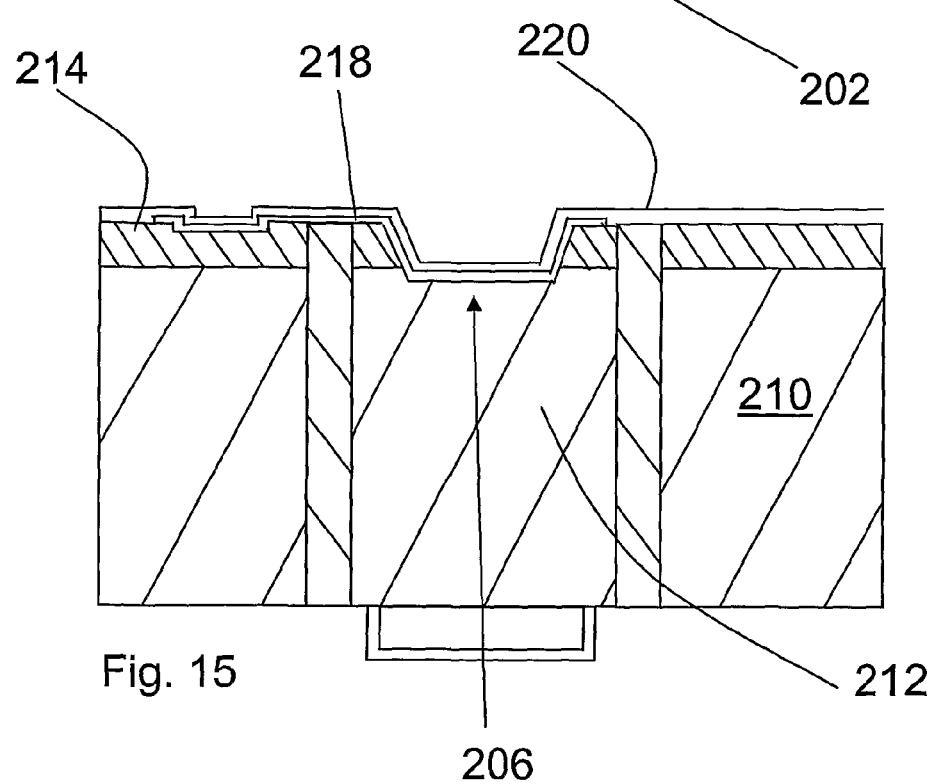
FIG. 15 illustrates making of metal contacts in accordance with the invention.

In a still further variation metal is used for the routing and contacts. This embodiment is shown in FIG. 15. Again, the vias 212 are made as described previously, in a low resistivity substrate wafer 210 having a high resistivity epitaxial layer 214 on top. Electronic circuits or components are made as desired in the top layer 214.

Again a depression 216 is formed by patterning/etching as previously described, the contact/routing structure 218 is defined by patterning and etching and metal is plated or deposited according to the pattern. Finally, a SiO$_2$ layer 220 is deposited on top of the wafer by PECVD.

The invention claimed is:

1. A wafer substrate for making integrated electronic circuits and/or components, the wafer substrate comprising;
   a low resistivity silicon base defining wafer native material;
   a high resistivity top layer;
   a front surface and a back surface; and
   a low resistivity wafer through connection,
   wherein:
      the low resistivity wafer through connection includes:
         a first end defined by a portion of the front surface, and
         a second end defined by a portion of the back surface;
      the low resistivity wafer through connection is defined between two trenches etched from the back surface, extending from the first end to the second end and filled with insulating material; and
      the low resistivity wafer through connection includes the low resistivity silicon base of the wafer native material essentially filling a volume between the two trenches.

2. The wafer of claim 1, wherein the low resistivity wafer through connections further comprise a top portion of epitaxially grown silicon.

3. An electronic device comprising;
   a component structure;
   a wafer on which the component structure is located, wherein the wafer comprises:
      a front surface;
      a back surface;
      insulating enclosures provided by at least two trenches etched from the back surface and filled with insulating material; and
      a wafer through connection, wherein:
         the wafer through connection includes:
            a first end defined by a portion of the front surface;
            a second end defined by a portion of the back surface; and
            wafer native material that extends between the first end and the second end, essentially fills inside the insulating enclosures, and is doped to exhibit a low resistivity; and
   areas of low resistivity between the wafer and the component structure.

4. An intermediate wafer product comprising;
   a planar substrate comprising a semiconductor material, provided with a pattern of spots having low resistivity, wherein the planar substrate has a front surface and a back surface;
   an electrical wafer through connection between the spots, and usable to make components on one side of the wafer, wherein the electrical wafer through connection has:
      a first end defined by a portion of the front surface,
      a second end defined by a portion of the back surface, and
      the semiconductor material extending between the first end and second end, and
      the electrical wafer through connection is defined by insulating enclosures provided by at least two trenches etched from the back surface of the planar substrate, wherein the volumes of the at least two trenches are filled with insulating material.

5. The wafer substrate of claim 1, wherein the front surface, the back surface, the first end, and the second end are planar.

6. The electronic device of claim 3, wherein the front surface, the back surface, the first end, and the second end are planar.

7. The intermediate wafer product of claim 4, wherein the front surface, the back surface, the first end, and the second end are planar.

* * * * *